US009595455B1

(12) United States Patent
Kasemset et al.

(10) Patent No.: US 9,595,455 B1
(45) Date of Patent: Mar. 14, 2017

(54) INTEGRATED CIRCUIT MODULE WITH FILLED CONTACT GAPS

(71) Applicant: NXP B.V., Eindhoven (NL)

(72) Inventors: Bodin Kasemset, Bangkok (TH); Peeradech Kunpukdee, Bangkok (TH)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/178,329

(22) Filed: Jun. 9, 2016

(51) Int. Cl.
*H01L 23/495* (2006.01)
*H01L 21/56* (2006.01)
*H01L 23/29* (2006.01)
*H01L 23/31* (2006.01)
*G06K 19/077* (2006.01)

(52) U.S. Cl.
CPC ............ *H01L 21/56* (2013.01); *H01L 21/568* (2013.01); *H01L 23/29* (2013.01); *H01L 23/3121* (2013.01); *H01L 23/4952* (2013.01); *H01L 23/49513* (2013.01); *H01L 23/49548* (2013.01); *H01L 23/49579* (2013.01); *G06K 19/07745* (2013.01); *H01L 2224/73265* (2013.01)

(58) Field of Classification Search
CPC ........... H01L 23/3121; H01L 23/49513; H01L 23/49541; H01L 23/49548; H01L 23/49579; H01L 21/76838; H01L 21/568; G06K 19/07754; G06K 19/07745
USPC ....................................................... 257/676
See application file for complete search history.

(56) References Cited

U.S. PATENT DOCUMENTS

| 5,134,773 | A | 8/1992 | LeMaire et al. |
| 6,350,952 | B1* | 2/2002 | Gaku ................... H01L 21/4857 174/522 |
| 7,176,582 | B2 | 2/2007 | Kloen et al. |
| 8,153,480 | B2 | 4/2012 | Steenbruggen et al. |
| 2002/0180014 | A1* | 12/2002 | Philpot ............... H01L 23/3121 257/678 |
| 2004/0080044 | A1* | 4/2004 | Moriyama .............. H01L 23/10 257/728 |
| 2011/0007478 | A1* | 1/2011 | Takahashi ........... H01L 23/3121 361/721 |
| 2011/0260308 | A1* | 10/2011 | Yen ..................... H01L 21/4821 257/676 |
| 2012/0018867 | A1* | 1/2012 | Toda ................... H01L 21/4828 257/676 |
| 2012/0044656 | A1* | 2/2012 | Lu ........................ H01L 23/495 361/748 |
| 2013/0075879 | A1* | 3/2013 | Yang .................... H01L 23/552 257/659 |

(Continued)

FOREIGN PATENT DOCUMENTS

| EP | 0880107 | A2 | 11/1998 |
| EP | 1655691 | A1 | 5/2006 |
| WO | 9935611 | A1 | 7/1999 |

*Primary Examiner* — Nathan W Ha

(57) ABSTRACT

Integrated circuit (IC) modules and methods for manufacturing the IC modules are described. In an embodiment, an IC module includes a substrate with contact gaps on which an IC die is attached with electrical connections between the IC die and the substrate. The IC module further include an encapsulation that encloses the IC die and fills first portions of the contact gaps, where the first portions of the contact gaps are located within an area of the substrate defined by the encapsulation. Second portions of the contact gaps, which are located outside of the area of substrate defined by the encapsulation, are filled with a filling material.

20 Claims, 7 Drawing Sheets

(56) References Cited

U.S. PATENT DOCUMENTS

| | | | |
|---|---|---|---|
| 2014/0239471 A1 | 8/2014 | Khunpukdee et al. | |
| 2014/0302640 A1* | 10/2014 | Qin | H01L 23/49582 438/108 |
| 2015/0001698 A1* | 1/2015 | Jaurigue | H01L 24/96 257/676 |
| 2015/0171022 A1* | 6/2015 | Sirinorakul | H01L 23/552 257/659 |

* cited by examiner

INTEGRATED CIRCUIT MODULE WITH FILLED CONTACT GAPS

Embodiments of the invention relate generally to electronic circuits and, more particularly, to integrated circuit (IC) modules with multiple electrical contacts and methods for manufacturing such IC modules.

An IC card, such as a smart card, includes an IC die with circuits that can be used to store information and perform data processing. For example, a portable IC card can be used in financial, transportation, security, healthcare, or other applications to provide identification and authentication.

The IC die for a smart card is packaged as an IC module, which typically includes the IC die, a substrate and a number of electrical contacts. The IC die is attached to one side of the substrate, while the electrical contacts are attached to the other side of the substrate. Since the electrical contacts need to be electrically isolated from each other, there are gaps between the electrical contacts. The electrical contacts are electrically connected to the IC die via bonding wires through the substrate. The IC die and the bonding wires are encapsulated in an appropriate material to provide structural support and well as protection.

One consideration in the design of an IC module for a smart card is ensuring that hot melt glue, which is typically used to attach the IC module to the body of the smart card, does not leak through the electrical contact gaps of the IC module, which could cause problems during the manufacturing process of the smart card. Other considerations in the IC module design include reduction of the IC module thickness and lower cost.

Integrated circuit (IC) modules and methods for manufacturing the IC modules are described. In an embodiment, an IC module includes a substrate with contact gaps on which an IC die is attached with electrical connections between the IC die and the substrate. The IC module further include an encapsulation that encloses the IC die and fills first portions of the contact gaps, where the first portions of the contact gaps are located within an area of the substrate defined by the encapsulation. Second portions of the contact gaps, which are located outside of the area of substrate defined by the encapsulation, are filled with a filling material.

In an embodiment, a method for manufacturing an integrated circuit (IC) module includes obtaining a substrate with contact gaps, attaching an IC die to the substrate, making electrical connections between the IC die and the substrate, dispensing an encapsulation material onto the IC die and into first portions of the contact gaps to form an encapsulation, the first portions of the contact gaps being located within an area of the substrate defined by the encapsulation, and dispensing a filling material into second portions of the contact gaps, the second portions of the contact gaps being located outside of the area of substrate defined by the encapsulation.

In an embodiment, the filling material is the same material as the encapsulation material.

In an embodiment, the filling material is the same material as the encapsulation material.

In an embodiment, dispensing the encapsulation material and dispensing the filling material are performed in a single dispensing process.

In an embodiment, dispensing the encapsulation material and dispensing the filling material are performed so that all the contact gaps are substantially filled with the encapsulation and filling materials.

In an embodiment, the substrate includes a metal leadframe with the contact gaps.

In an embodiment, the metal leadframe is made of Copper, any Copper alloy or stainless steel.

In an embodiment, at least some of the contact gaps of the metal leadframe include structures to anchor the encapsulation to the metal leadframe.

In an embodiment, the structures are contiguous with the contact gaps and include wider gaps than the contact gaps.

In an embodiment, prior to dispensing the encapsulation and filling materials, attaching a tape to a surface of the metal leadframe on the opposite side of the metal leadframe on which the IC die is attached to the metal leadframe.

In an embodiment, an integrated circuit (IC) module includes a substrate with contact gaps, an IC die attached to the substrate, a plurality of electrical connections between the IC die and the substrate, and an encapsulation that encloses the IC die and fills first portions of the contact gaps, the first portions of the contact gaps being located within an area of the substrate defined by the encapsulation, wherein second portions of the contact gaps are filled with a filling material, the second portions of the contact gaps being located outside of the area of substrate defined by the encapsulation.

In an embodiment, the filling material is the same material as the encapsulation material.

In an embodiment, the filling material include epoxy mold compound.

In an embodiment, all the contact gaps are substantially filled with the encapsulation and filling materials.

In an embodiment, the substrate includes a metal leadframe with the contact gaps.

In an embodiment, at least some of the contact gaps of the metal leadframe include structures to anchor the encapsulation to the metal leadframe.

In an embodiment, the structures are contiguous with the contact gaps and include wider gaps than the contact gaps.

In an embodiment, an integrated circuit (IC) module includes a metal leadframe with contact gaps, an IC die attached to the metal leadframe, a plurality of bond wires connected to the IC die and the metal leadframe, and an encapsulation that encloses the IC die and fills first portions of the contact gaps, the first portions of the contact gaps being located within an area of the metal leadframe defined by the encapsulation, wherein second portions of the contact gaps are filled with a filling material, the second portions of the contact gaps being located outside of the area of metal leadframe defined by the encapsulation.

In an embodiment, the filling material include epoxy mold compound.

In an embodiment, at least some of the contact gaps of the metal leadframe include structures to anchor the encapsulation to the metal leadframe, the structures being contiguous with the contact gaps and including wider gaps than the contact gaps.

Other aspects and advantages of embodiments of the present invention will become apparent from the following detailed description, taken in conjunction with the accompanying drawings, depicted by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
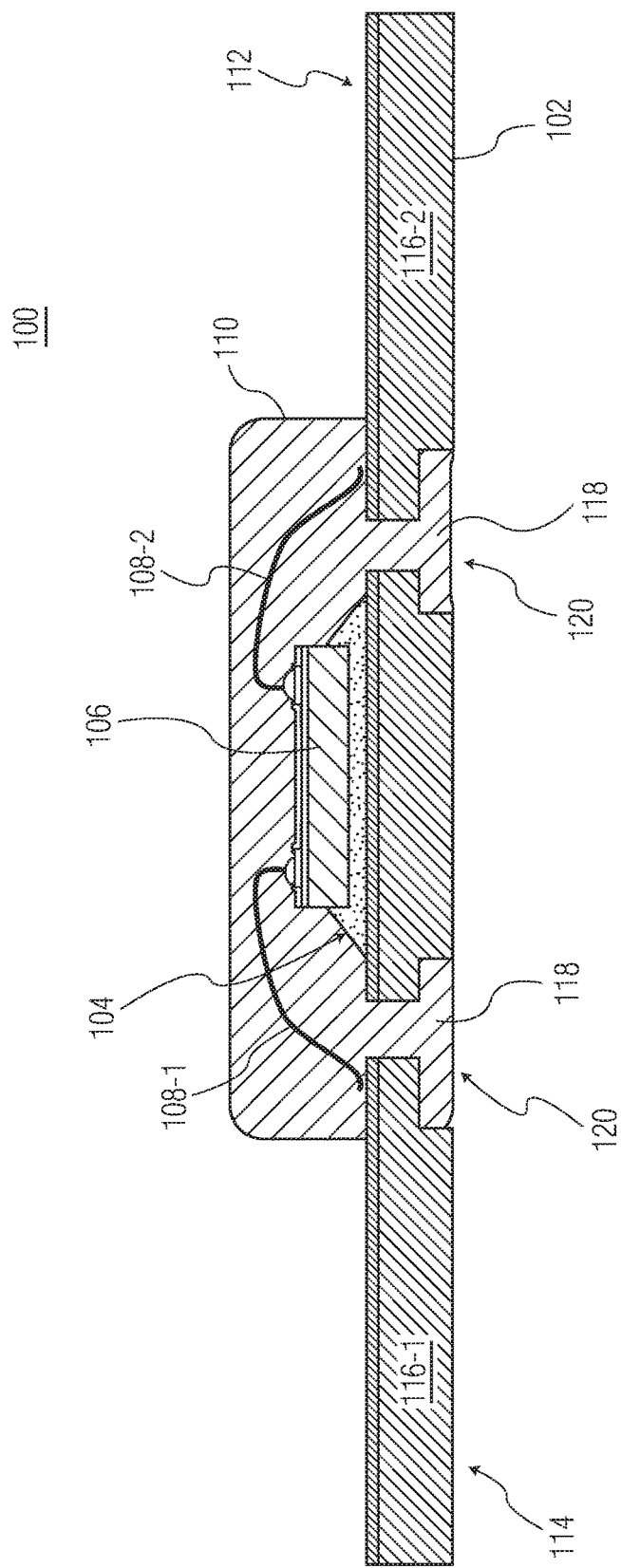
FIG. 1 is a cross-sectional view of an IC module in accordance with an embodiment of the invention.

FIG. 1 is a cross-sectional view of an IC module 100 in accordance with an embodiment of the invention. The IC module can be used in a smart card for financial, transportation, security, healthcare, or other applications to store information and perform data processing. In some embodiments, the IC module has the ability to securely manage, store and provide access to data in the IC module, perform on-module functions, such as encryption, authentication, and authorization, and interact intelligently with a card reader. The IC module can communicate with a card reader via electrical contacts. As described in more detail below, the design of the IC module allows the IC module to be made thinner and with lower cost than comparable IC modules.

In the embodiment depicted in FIG. 1, the IC module 100 includes a substrate 102, an adhesive material 104, an IC die or chip 106, bond wires 108-1 and 108-2 and an encapsulation 110. Although the IC module is shown in FIG. 1 as including certain components, in other embodiments, the IC module may include fewer components or additional components that are commonly found in conventional IC modules.

In the illustrated embodiment, the substrate 102 is a metal leadframe having a first surface 112 on which the IC die is mounted and a second surface 114, which serves as electrical contact areas for signal transmission. The metal leadframe is separated into different electrically isolated sections, e.g., sections 116-1 and 116-2, so that the metal leadframe can function as electrical contact pads for the IC module. Thus, the electrically isolated sections of the metal leadframe will sometime be referred to herein as electrical contact pads. In order to electrically isolate the electrical contact pads, there are spaces or gaps 118 between the electrical contacts. In FIG. 1, the IC module is shown with two contact gaps, which are located below the encapsulation 110 of the IC module. However, the IC module has additional contact gaps, which are not shown in FIG. 1. The contact gaps of the IC module will be further described below with reference to FIG. 2.

Figure 2:
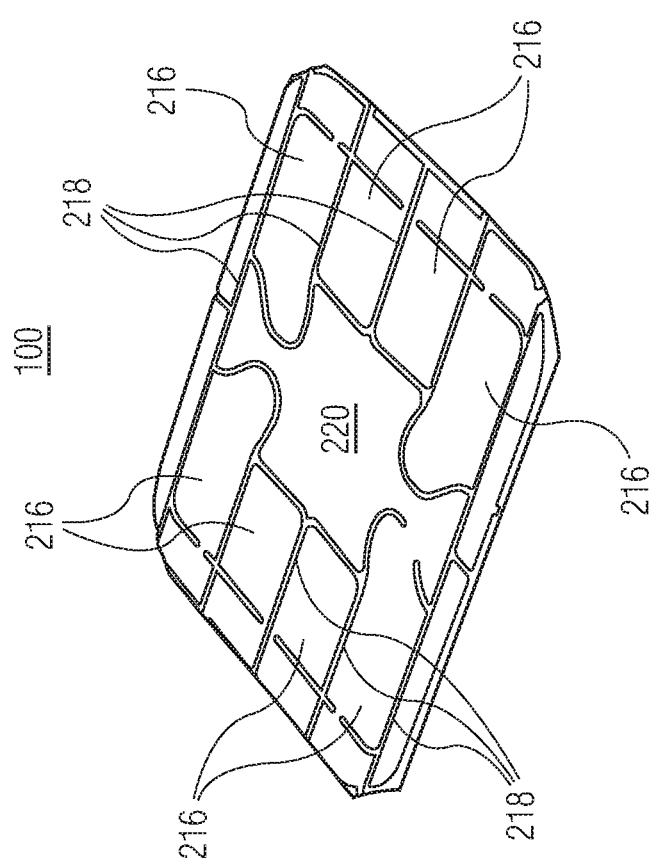
FIG. 2 is a front side view of the IC module.

FIG. 2 is a front side view of the IC module 100 in accordance with an embodiment of the invention. The front side of the IC module is the exposed surface of the IC module when the IC module is mounted onto the body of a smart card, which is the second surface 114 depicted in FIG. 1. As shown in FIG. 2, the IC module includes a number of electrical contact pads 216, which are sections or portions of the metal leadframe 102. These electrical contact pads have gaps 218 between them, which extend throughout the front side of the IC module. In FIG. 2, all the lines between the contact pads are contact gaps. The center region 220 of the IC module is the location of where the IC die 106 is mounted on the other of the metal leadframe and enclosed by the encapsulation 110. Thus, the contact gaps near the center region will be exposed to the encapsulation. In other words, the encapsulation will fill these contact gaps when the encapsulation is formed. In some embodiments, the exposed surfaces of the contact pads may be coated or plated with a non-corrosive conductive material, such as Gold (Au), Silver (Ag), Nickel (Ni), Palladium (Pd) or other appropriate material.

Turning back to FIG. 1, in the illustrated embodiment, the metal leadframe 102 is configured or shaped so that at least some of the contact gaps 118 include coining structures 120. As shown in FIG. 1, the coining structures are wider gaps of some of the contact gaps at the second surface 114 of the metal leadframe. The coining structures help anchor the encapsulation 110 to the metal leadframe when the encapsulation is formed or solidified in these contact gaps. Thus, the coining structures can prevent the encapsulation of the IC module 100 from being detached from rest of the IC module. The coining structures may be strategically placed so that only portions of the contact gaps that are below or will be filled by the encapsulation will have the coining structures. With different outlines and sizes of the IC module, gap width can be designed to be in the range of 1.00 mm to 5.62 mm. Coining structure thickness can be in the range of 25% up to 50% of the total thickness of leadframe. In addition, coining structure width can be over 0.1 mm based on design and coining process technology.

Figure 3:
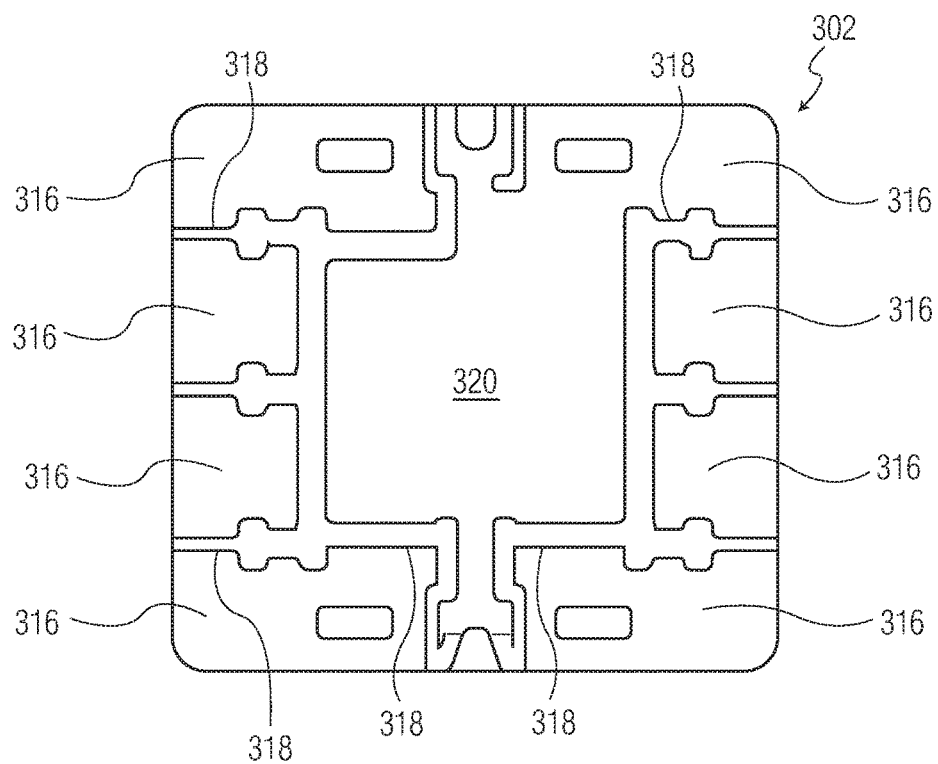
FIG. 3 is a front side view of a metal leadframe of the IC module in accordance with an embodiment of the invention.

The metal leadframe 102 can be made of any metal or alloy-based material. As an example, the metal leadframe may be made of Copper (Cu), Copper-Tin alloy, such as CuSn6, Copper-Iron (CuFe) alloy, Copper Chromium (CuCr) or other appropriate copper alloy or stainless steel. The metal leadframe may be formed using stamping technology on reel-to-reel material. An example of a stamped metal leadframe 302 that can be used in the IC module 100 in accordance with an embodiment of the invention is shown in FIG. 3, which is a view of the side on which an IC die is to be mounted on the leadframe. As shown in FIG. 3, the metal leadframe includes a central region 320, where an IC die can be attached. The metal leadframe also includes different electrically isolated sections 316, which will be used as contact pads for the resulting IC module. These electrically isolated sections are separated to each other by contact gaps 318.

Unlike a conventional substrate of a smart card module that includes thick glass-epoxy structure with a metal layer for the contact pads, the metal leadframe 302 can be made relatively thin. As an example, a conventional substrate of a smart card module may be 150-170 microns thick, while the metal leadframe may be 60-100 microns thick. Thus, the overall thickness of the resulting IC module can be significantly reduced when compared to conventional smart card modules.

Turning back to FIG. 1, the IC die 106 of the IC module 100 is mounted on the metal leadframe 102 using the adhesive material 104. The IC die includes circuitry to securely manage, store and provide access to data on the IC module and/or perform on-module functions, such as encryption, authentication, and authorization. The IC die is designed to communicate with another device (e.g., a card reader) by electrical contact through the contact pads, which are formed by the sections 116 of the metal leadframes. Thus, electrical connections are required between the IC die and these sections of the metal leadframes. In the illustrated embodiment, the IC die is electrically connected to the sections of the metal leadframes via bond wires 108. The bond wires may be made of any suitable metal (e.g., Aluminum or Copper). In the embodiment depicted in FIG. 1, the bond wire 108-1 electrically connects the IC die to the section 116-1 of the metal leadframe, while the bond wire 108-2 electrically connects the IC die to the section 116-2 of the metal leadframe. Bond pads may be used to attach the bond wires to the IC die and the metal leadframe. Although only two bond wires are illustrated in FIG. 1, the IC module may include additional bond wires. Also, in the embodiment depicted in FIG. 1, the IC module includes a single IC die, which can be access using the contact pads. However, in other embodiments, the IC module may include more than one IC die and may include a contactless interface to access one or more of these IC dies.

Figure 4:
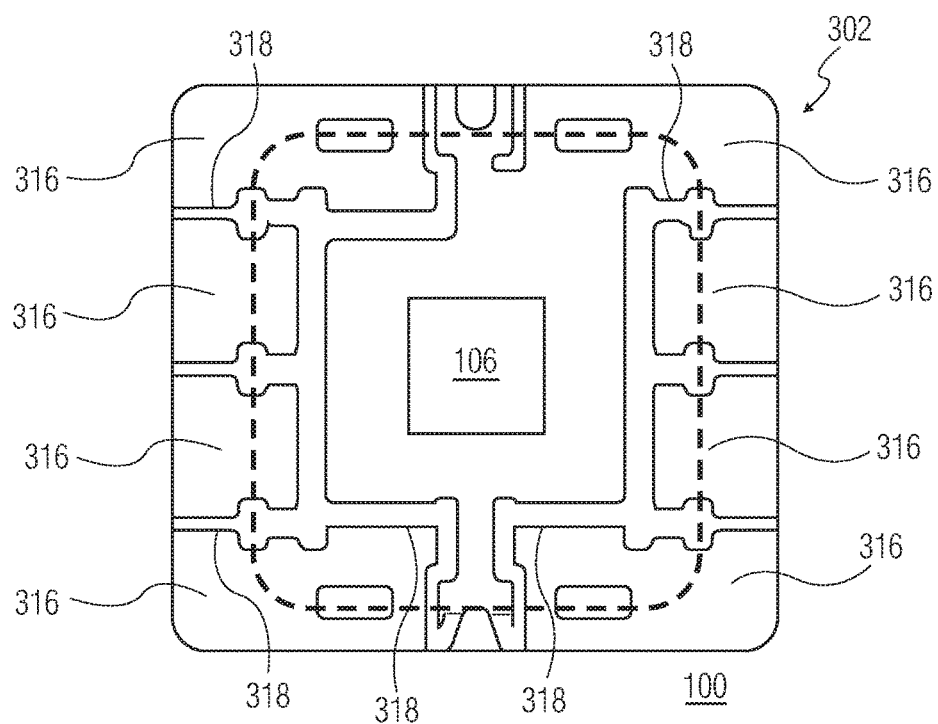
FIG. 4 is a front side view of the IC module with an encapsulation shown in phantom in accordance with an embodiment of the invention.

The encapsulation 110 of the IC module 100 is used to protect the bond wires 108 and the IC die 106. The encapsulation may be made of any suitable material, such as epoxy mold or molding compound (EMC) or materials used for glob top or dam & fill process. The encapsulation encloses the IC die and the bond wires 108. In addition, the encapsulation fills in some of the contact gaps 118 with the coining structures 120 around the IC die, as shown in FIG. 1. The remaining contact gaps are also filled with an appropriate filling material, which will prevent adhesive material, e.g., hot melt glue, from seeping through these contact gaps when the IC module is being attached to the body of a smart card. The filling material may be the same material used for the encapsulation, such as EMC, or may be a different material. The remaining contact gaps that are filled with the filling material are illustrated in FIG. 4, which is a front side view of the IC module 100 with the metal leadframe 302 depicted in FIG. 3. The front side of the IC module is where the IC die 106 is mounted. In FIG. 4, the encapsulation is shown in phantom so that the underlying components can be seen. The contact gaps 318 below the encapsulation, or located within the area of the metal leadframe defined by the encapsulation (i.e., the phantom outline of the encapsulation), will be filled with the encapsulation material when the encapsulation is being formed. The contact gaps that are outside of the encapsulation, or located outside of the area of the metal leadframe defined by the encapsulation (i.e., the phantom outline of the encapsulation), will be filled with the filling material, which may be the same material used for the encapsulation. Thus, all of the contact gaps of the IC module can be substantially filled with the encapsulation material and/or the filling material. As used herein, "substantially filled" means that more than 90 percent of the contact gaps are filled.

Figure 5:
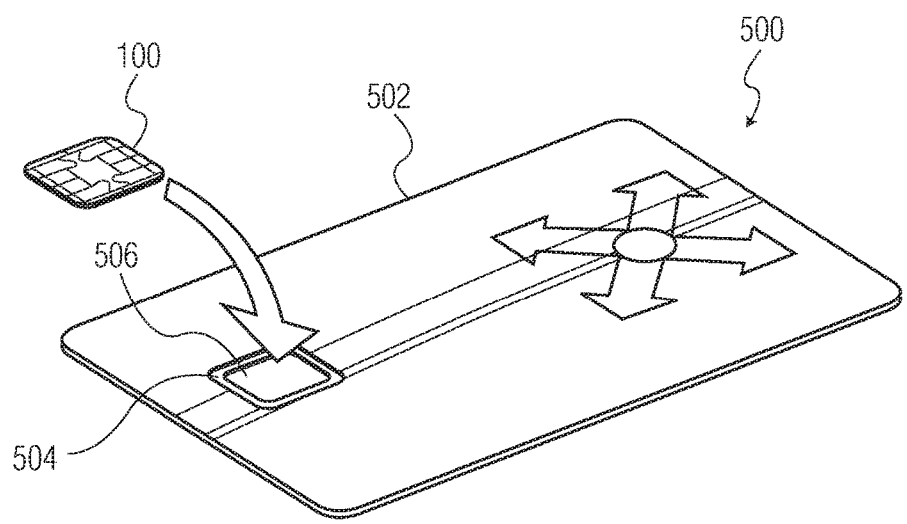
FIG. 5 illustrates the IC module being attached to the body of a smart card in accordance with an embodiment of the invention.
Figure 6:
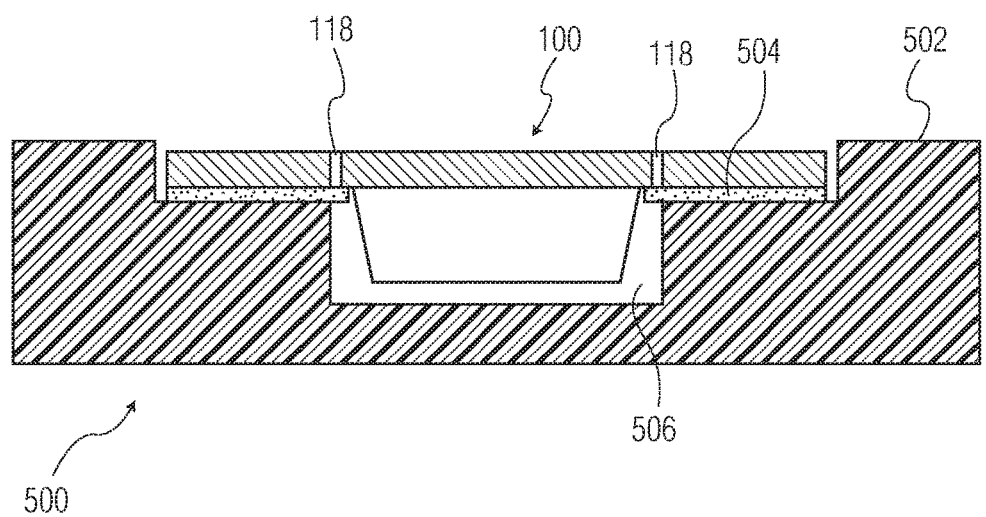
FIG. 6 is a cross-sectional view of the IC module attached to the body of a smart card.

As illustrated in FIG. 5, the IC module 100 can be attached the body 502 of a smart card 500 using an adhesive material 504, e.g., hot melt glue, by placing the adhesive material, in a cavity 506 of the smart card body. The adhesive material used to attached the IC module to the smart card body is further illustrated in FIG. 6, which is a cross-sectional illustration of the IC module attached the smart card body using the adhesive material. If the contact gaps 118 of the IC module are not filled, the adhesive material 504 will seep through the contact gaps, which can cause problems, such as smart cards being glued to other smart cards or to other devices or surfaces.

Figure 7A:
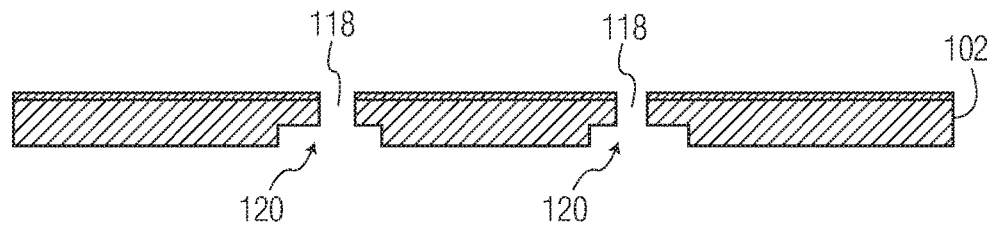
FIGS. 7A-7D illustrate a process of manufacturing the IC module depicted in FIG. 1 in accordance with a first embodiment of the invention.
Figure 7B:
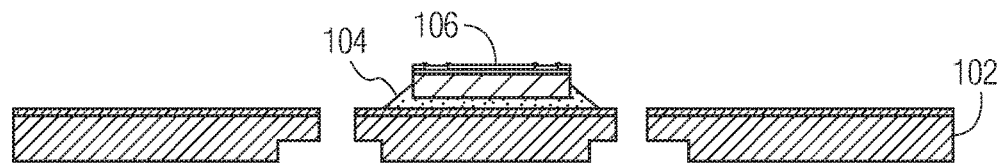
Figure 7C:
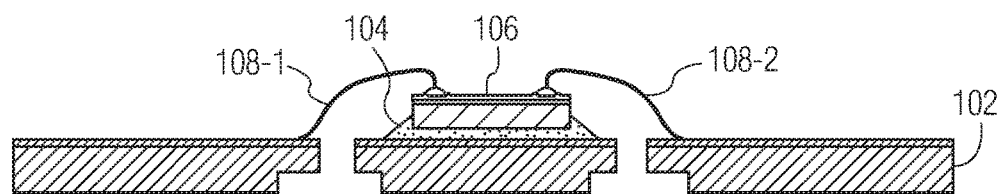
Figure 7D:
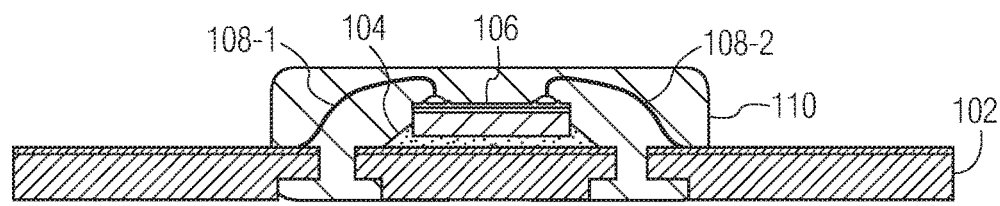

A process of manufacturing the IC module 100 in accordance with a first embodiment of the invention is described with reference to FIGS. 7A-7D. As illustrated in FIG. 7A, the process of manufacturing the IC module begins by obtaining the metal leadframe 102, which includes contact gaps 118 with coining structures 120 (for at least some of the contact gaps). In some embodiments, the metal leadframe may be part of a reel-to-reel leadframe. Next, as illustrated in FIG. 7B, the IC die 106 is attached to the metal leadframe using the adhesive material 104. Next, as illustrated in FIG. 7C, the bond wires 108 are attached to the IC die and sections of the metal leadframe to provide electrical connections. Next, as illustrated in FIG. 7D, the material for the encapsulation 100 is dispensed onto the IC die and the bond wires, as well as into all the contact gaps, including the contact gaps that are within and outside of the area defined by the encapsulation. Gaps between contacts are filled by either molding process using epoxy mold compound filling within the mold cavity or dispensing process using thermoplastic materials, such as glob top, along the gap lines. Epoxy mold compound or dispensable thermoplastic material flows into the gaps and fills all over the gap. In the illustrated embodiment, the material is epoxy mold compound (EMC). However, other materials may be used in other embodiments. In some alternative embodiments, the encapsulation can be formed, which only fills the contact pads below the encapsulation, i.e., within the area defined by the encapsulation. The remaining contact gaps can then be filled in another step using the same or different material with respect to the encapsulation.

Figure 8A:
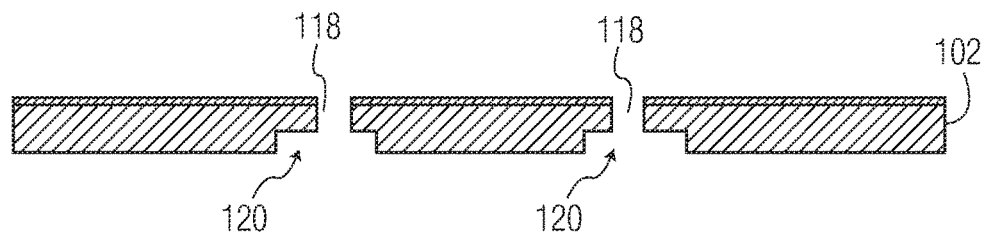
FIGS. 8A-8F illustrate a process of manufacturing the IC module depicted in FIG. 1 in accordance with a second embodiment of the invention.
Figure 8B:
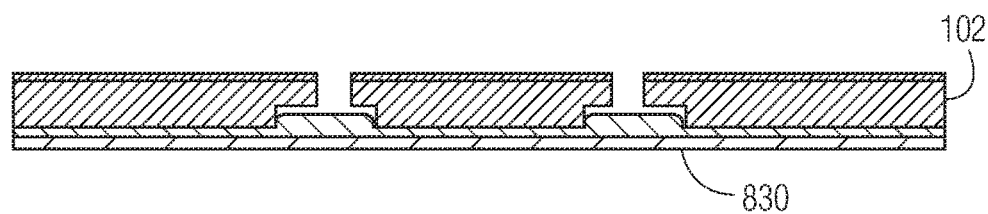
Figure 8C:
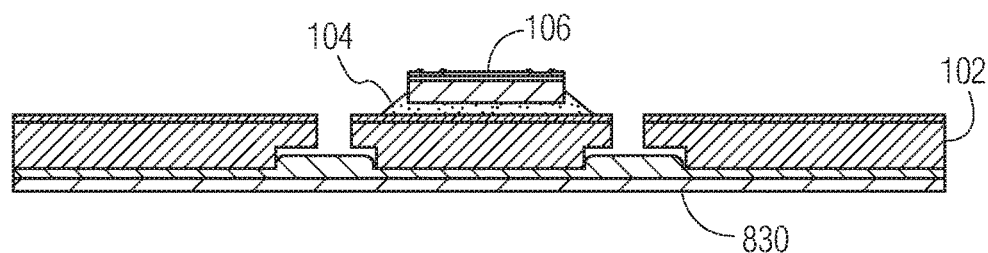
Figure 8D:
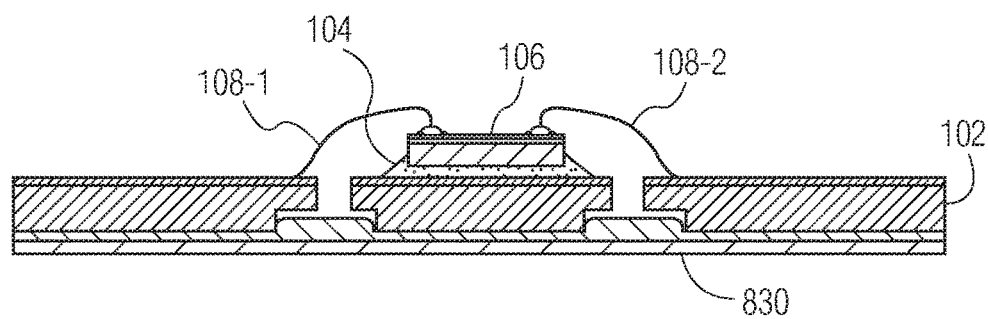
Figure 8E:
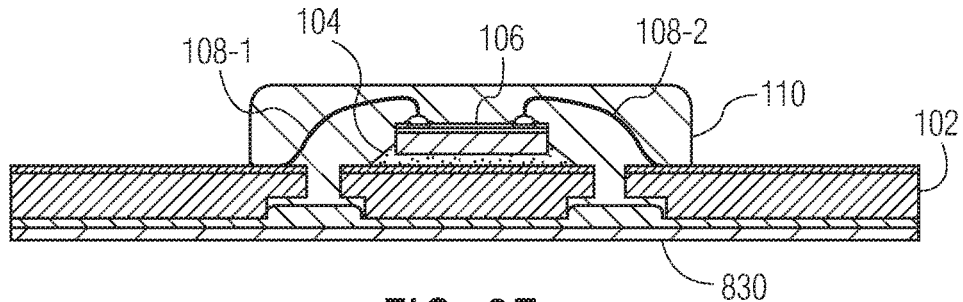
Figure 8F:
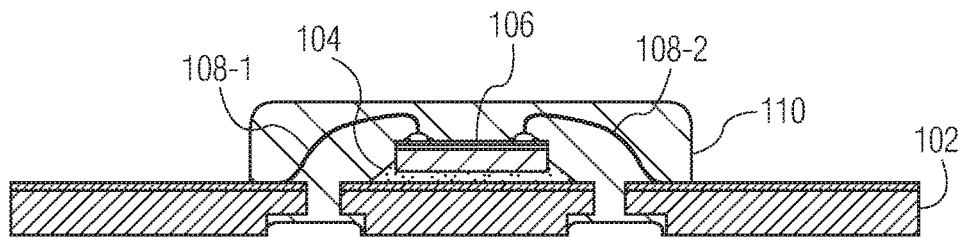

A process of manufacturing the IC module 100 in accordance with a second embodiment of the invention is described with reference to FIGS. 8A-8F. As illustrated in FIG. 8A, the process of manufacturing the IC module begins by obtaining the metal leadframe, which includes contact gaps with coining structures (for at least some of the contact gaps). In some embodiments, the metal leadframe may be part of a reel-to-reel leadframe. Next, as illustrated in FIG. 8B, a tape 830 is applied to the second surface (or bottom) of the metal leadframe. As an example, the tape may be a polymide (PI) tape. Next, as illustrated in FIG. 8C, the IC die 106 is attached to the metal leadframe using the adhesive material 104. Next, as illustrated in FIG. 8D, the bond wires 108 are attached to the IC die and sections of the metal leadframe to provide electrical connections. Next, as illustrated in FIG. 8E, the material for the encapsulation 110 is dispensed onto the IC die and the bond wires, as well as into all the contact gaps down to the tape 830 attached to the backside of the metal leadframe. In the illustrated embodiment, the material is epoxy mold compound (EMC). However, other materials may be used in other embodiments. In some alternative embodiments, the encapsulation can be formed, which only fills the contact pads below the encapsulation. The remaining contact gaps can then be filled in another step using the same or different material with respect to the encapsulation. Next, as illustrated in FIG. 8F, the tape 830 is removed from the metal leadframe. The use of the tape allows the material in the contact pads to have less mold flash on the contact pads or on the front side surface of the metal leadframe. In addition, it prevents or limits contamination from dispensing filled materials in the contact gaps to flow over on other areas on front side surface of the metal leadframe. This results in a reduction of additional cleaning process of the front side of surface to remove unwanted materials.

Figure 9:
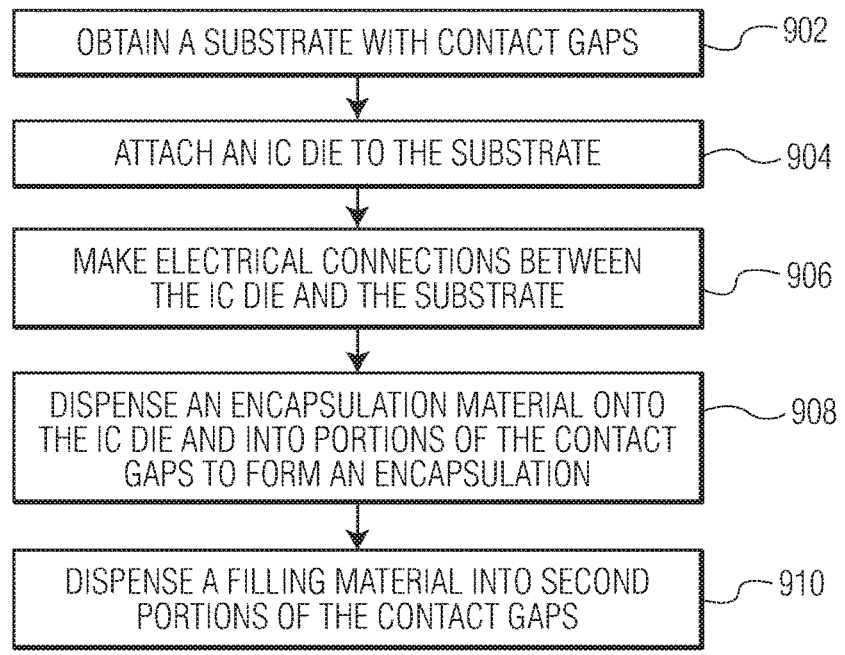
FIG. 9 is a process flow diagram of a method for manufacturing an IC module in accordance with an embodiment of the invention.

FIG. 9 is a process flow diagram of a method for manufacturing an IC module in accordance with an embodiment of the invention. At block 902, a substrate with contact gaps is obtained. The substrate may be a metal leadframe with contact gaps. Next, at block 904, an IC die is attached to the substrate. Next, at block 906, electrical connections are made between the IC die and the substrate. Next, at block 908, an encapsulation material is dispensed onto the IC die and into first portions of the contact gaps to form an encapsulation. The first portions of the contact gaps are located within an area of the leadframe defined by the encapsulation. Next, at block 910, a filling material is dispensed into second portions of the contact gaps. The second portions of the contact gaps are located outside of the area of leadframe defined by the encapsulation.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more feature.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A method for manufacturing an integrated circuit (IC) module, the method comprising:
   obtaining a substrate with contact gaps;
   attaching an IC die to the substrate;
   making electrical connections between the IC die and the substrate;
   dispensing an encapsulation material onto the IC die and into first portions of the contact gaps to form an encapsulation, the first portions of the contact gaps being located within an area of the substrate defined by the encapsulation; and
   dispensing a filling material into second portions of the contact gaps, the second portions of the contact gaps being located outside of the area of substrate defined by the encapsulation.

2. The method of claim 1, wherein the filling material is the same material as the encapsulation material.

3. The method of claim 1, wherein the filling material include epoxy mold compound.

4. The method of claim 1, wherein dispensing the encapsulation material and dispensing the filling material are performed in a single dispensing process.

5. The method of claim 1, wherein dispensing the encapsulation material and dispensing the filling material are performed so that all the contact gaps are substantially filled with the encapsulation and filling materials.

6. The method of claim 1, wherein the substrate includes a metal leadframe with the contact gaps.

7. The method of claim 1, wherein the metal leadframe is made of Copper, Copper alloy or stainless steel.

8. The method of claim 6, wherein at least some of the contact gaps of the metal leadframe include structures to anchor the encapsulation to the metal leadframe.

9. The method of claim 8, wherein the structures are contiguous with the contact gaps and include wider gaps than the contact gaps.

10. The method of claim 6, prior to dispensing the encapsulation and filling materials, attaching a tape to a surface of the metal leadframe on the opposite side of the metal leadframe on which the IC die is attached to the metal leadframe.

11. An integrated circuit (IC) module comprising:
    a substrate with contact gaps;
    an IC die attached to the substrate;
    a plurality of electrical connections between the IC die and the substrate; and
    an encapsulation that encloses the IC die and fills first portions of the contact gaps, the first portions of the contact gaps being located within an area of the substrate defined by the encapsulation,
    wherein second portions of the contact gaps are filled with a filling material, the second portions of the contact gaps being located outside of the area of substrate defined by the encapsulation.

12. The IC module of claim 11, wherein the filling material is the same material as the encapsulation material.

13. The IC module of claim 11, wherein the filling material include epoxy mold compound.

14. The IC module of claim 11, wherein all the contact gaps are substantially filled with the encapsulation and filling materials.

15. The IC module of claim 11, wherein the substrate includes a metal leadframe with the contact gaps.

16. The IC module of claim 15, wherein at least some of the contact gaps of the metal leadframe include structures to anchor the encapsulation to the metal leadframe.

17. The IC module of claim 16, wherein the structures are contiguous with the contact gaps and include wider gaps than the contact gaps.

18. An integrated circuit (IC) module comprising:
   a metal leadframe with contact gaps;
   an IC die attached to the metal leadframe;
   a plurality of bond wires connected to the IC die and the metal leadframe; and
   an encapsulation that encloses the IC die and fills first portions of the contact gaps, the first portions of the contact gaps being located within an area of the metal leadframe defined by the encapsulation,
   wherein second portions of the contact gaps are filled with a filling material, the second portions of the contact gaps being located outside of the area of metal leadframe defined by the encapsulation.

19. The IC module of claim 18, wherein the filling material include epoxy mold compound.

20. The IC module of claim 18, wherein at least some of the contact gaps of the metal leadframe include structures to anchor the encapsulation to the metal leadframe, the structures being contiguous with the contact gaps and including wider gaps than the contact gaps.

* * * * *